United States Patent [19]

Ebbing et al.

[11] Patent Number: 5,129,994

[45] Date of Patent: Jul. 14, 1992

[54] METHOD AND APPARATUS TO INHIBIT OBSTRUCTION OF OPTICAL TRANSMISSION THROUGH SEMICONDUCTOR ETCH PROCESS CHAMBER VIEWPORT

[75] Inventors: Peter F. Ebbing, Los Altos; Kien N. Chuc; Jack Ford, both of San Jose; Fred H. Hariz, Fremont; Michael N. Sugarman, San Francisco, all of Calif.

[73] Assignee: Applied Materials, Inc., Santa Clara, Calif.

[21] Appl. No.: 690,137

[22] Filed: Apr. 23, 1991

[51] Int. Cl.$^5$ ............... H01L 21/306; B44C 1/22
[52] U.S. Cl. .................... 156/643; 156/626; 156/646; 156/345
[58] Field of Search ............ 156/345, 643, 646, 626; 118/712, 713, 724, 50.1, 620, 641; 204/298.31, 298.32; 134/1; 219/121.4, 121.41, 121.51, 121.59

[56] References Cited

U.S. PATENT DOCUMENTS

| | | | |
|---|---|---|---|
| 4,857,139 | 8/1989 | Tashiro et al. | 156/643 |
| 4,883,560 | 11/1989 | Ishihara | 156/626 |
| 4,964,940 | 10/1990 | Auvert et al. | 156/345 |
| 5,002,631 | 3/1991 | Giapis et al. | 156/643 |

Primary Examiner—William A. Powell
Attorney, Agent, or Firm—John P. Taylor

[57] ABSTRACT

A method and apparatus are described for inhibiting visual obstruction of the window of a semiconductor etch process chamber by deposition of each byproducts thereon by selectively heating the window surfaces adjacent one edge of the window to thereby form a cool region on the window surfaces adjacent the opposite edge of the window whereby the center of the window will remain substantially clear of such depositions. The apparatus for carrying out the method of the invention comprises a first heat transmitting structure disposed on one surface of an optically transparent window adjacent one edge, and a second heat transmitting structure disposed on the opposite surface of the optically transparent window adjacent the same edge to thereby provide even heating of both surfaces of the window adjacent the one edge, thereby creating a cooler zone on the window surfaces adjacent the opposite edge of the window.

25 Claims, 6 Drawing Sheets

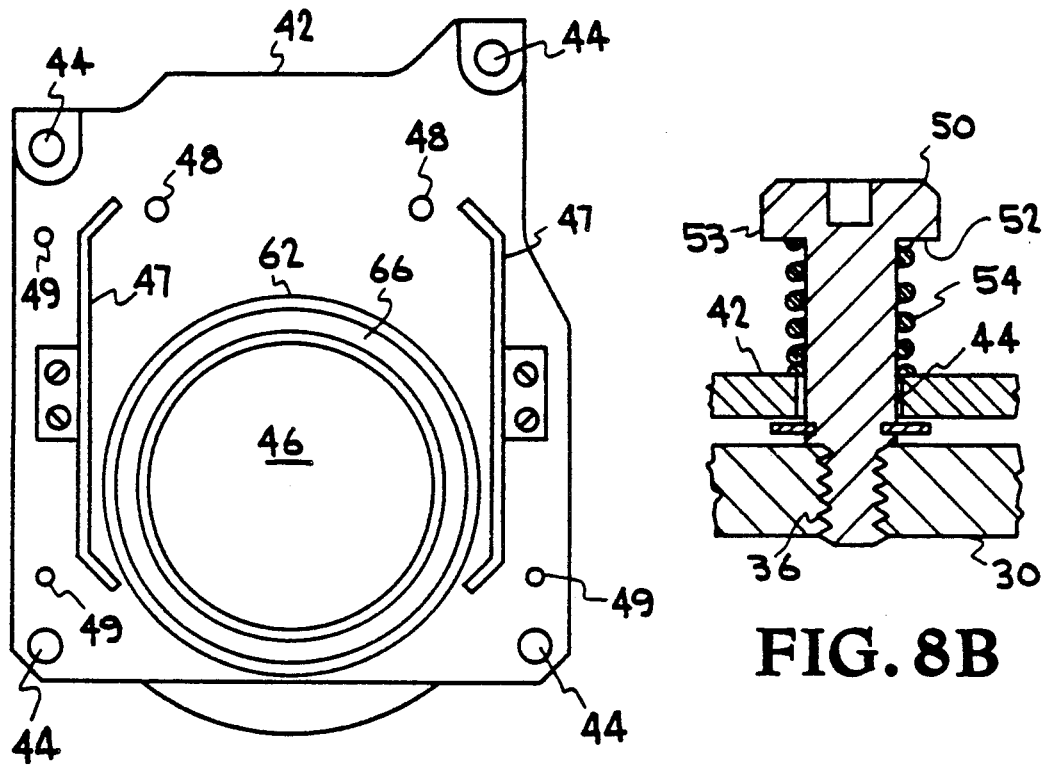
FIG. 8A
FIG. 8B
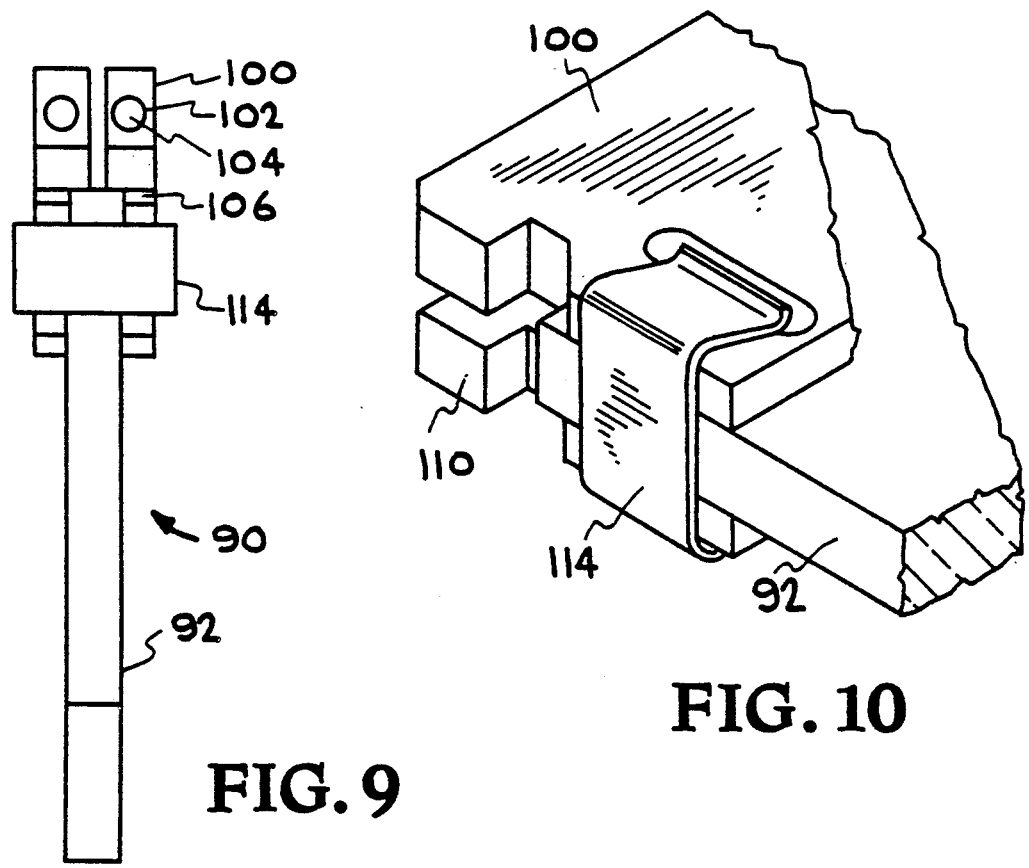
FIG. 9
FIG. 10

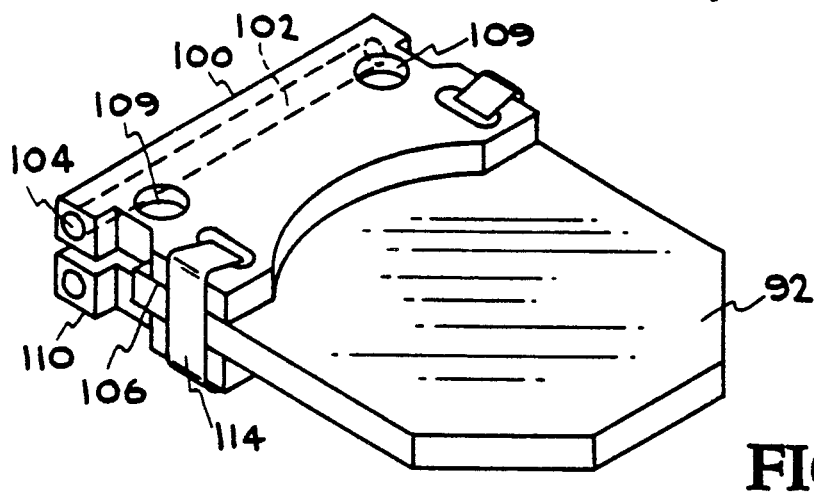
FIG. 11
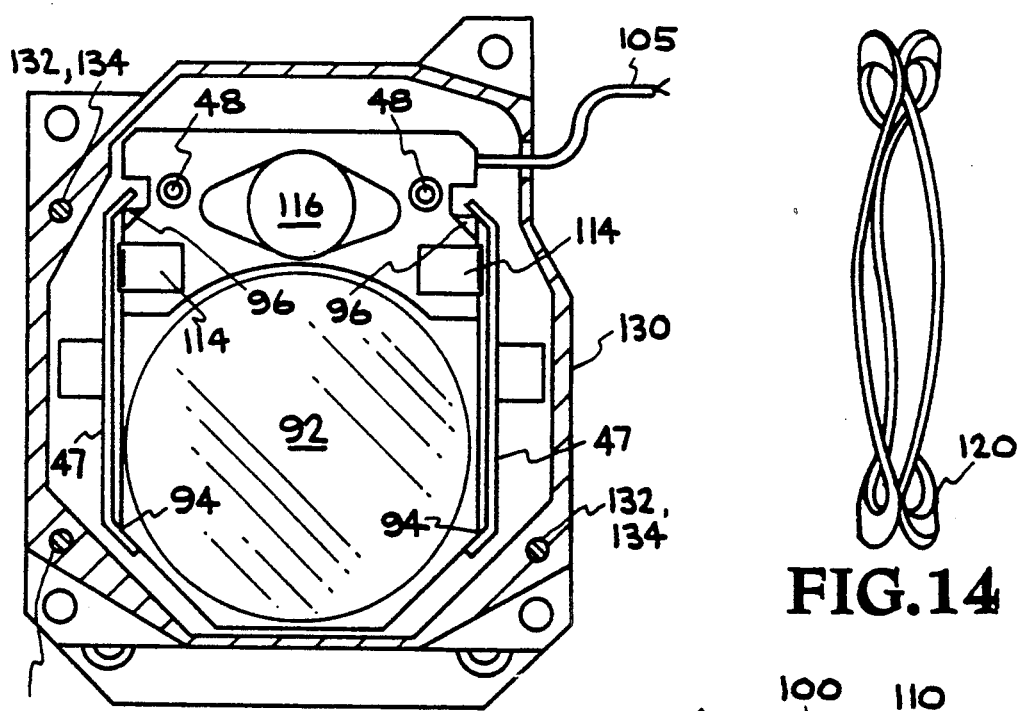
FIG. 12
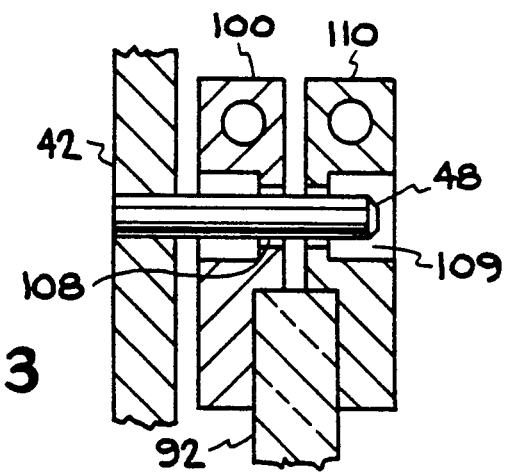
FIG. 14
FIG. 13

METHOD AND APPARATUS TO INHIBIT OBSTRUCTION OF OPTICAL TRANSMISSION THROUGH SEMICONDUCTOR ETCH PROCESS CHAMBER VIEWPORT

BACKGROUND OF THE INVENTION

1. Field of the Invention

This invention relates to a method and apparatus for inhibiting obstruction of optical transmission through a semiconductor etch process chamber window or viewport by deposition of polymeric materials on the window. More particularly, it relates to a method and apparatus for selectively heating the window to selectively inhibit such deposition.

2. Description of the Related Art

In the processing of semiconductor wafers to form integrated circuit structures, the selectively removal of materials is carried out by etching. Such etch removal processing may involve a wet chemistry etch, but more likely will involve a dry etch in a sealed plasma etching chamber, which may be under vacuum, and wherein the progress of the etch will be monitored optically through a viewing window or "viewport". Typically such optical monitoring involves monitoring certain known emission lines, e.g., the 288 nm. $CO_2$ line or the 484 nm. CO line, through a window provided in a chamber wall of the etch chamber comprising an optically transparent material.

Such plasma etch processing usually also involves the formation and deposition of polymeric materials, e.g., carbon/hydrogen products, in the chamber which deposit on the wafer and are consumed during the course of the etch process. Such polymeric formation, deposition, and consumption of same on selective surfaces of the wafer, are of great benefit in certain etch processes to assist in maintaining desired anisotropic properties of the dry etch.

However, the deposition of such polymeric materials is usually not limited to deposition on the wafer, but also occurs on all internal surfaces of the chamber as well to varying degrees. Chamber surfaces closest to the gas inlets, surfaces in direct line of sight of such inlets, and surfaces at lower temperatures (than the wafer temperature) are coated quicker, and heavier, than other surfaces, by a phenomenon known as thermophoresis meaning "being carried by heat".

When the etch chamber is equipped with one or more viewing windows or viewports for optical monitoring of the progress of the etch by monitoring the composition of the excited species adjacent to the wafer surfaces, such window surfaces also become coated with this polymeric material and/or other etch residues. Such depositions cloud the window causing instrumentation monitoring of the plasma to either not perform or malfunction.

This problem can be seen by comparing the emission spectra shown in FIGS. 1 and 2. FIG. 1 shows the emission spectra for a new or clean viewport or window, while FIG. 2 shows the emission spectra seen through the same window after about 230 minutes of use which shows the effects of such depositions thereon. In particular, it will be noted that the wavelength region of about 250 nm. to 450 nm., the very region where the emission lines of interest are monitored, appears to be the most severely impacted by the depositions on the surface of the window.

This problem of deposition of etch residues on the surfaces of the etch chamber, including the window, has been addressed in the prior art. Attempts to reduce such depositions on viewing windows have previously included the interposing of fine mesh screens in front of the window, placing the window at the end of a long tube in the etch chamber fabricated of nonconducting material, and by heating the window.

However, these prior art attempts to solve the problem are not without their own problems. Screens and wires obstruct the view and require periodic cleaning, long tubes prevent a wide field of vision, and windows equipped with perimeter heaters still become coated at the slightly cooler center. In fact, it has been noted that some migration of the deposited materials toward such cooler surfaces occurs when heaters are employed to heat the window surface.

In addition, the use of heated windows in combination with insulation materials to prevent thermal coupling between the heated window and the etch chamber resulted in deterioration of the insulation materials causing debris, noxious odors, and most importantly, sublimation of outgassing products of the insulation onto the outer surface of the window resulting in film formation which interfered with plasma light transmission and optical monitoring of the etch.

It would, therefore, be desirable to provide a method and apparatus for inhibiting the obstruction of optical transmission through the viewport or window of a semiconductor etch process chamber by either deposition of polymeric materials, etch byproducts, or residues on the inner surface of the window or deposition of insulation byproducts on the exterior surface of the window.

SUMMARY OF THE INVENTION

The invention provides a method and apparatus for inhibiting obstruction of optical transmission through the window of a semiconductor etch process chamber by deposition of polymeric materials thereon which comprises selectively heating the window surfaces adjacent one edge of the window to thereby form a cool region on the window surfaces adjacent the opposite edge of the window, whereby the center of the window will remain substantially free of such depositions. The apparatus for carrying out the method of the invention comprises first heating means disposed on one surface of an optically transparent window adjacent one edge of the widow, and second heating means disposed on the opposite surface of the optically transparent window to thereby provide even heating of both surfaces of the window adjacent the same edge, thereby creating a cooler zone on the opposite edge of the window.

BRIEF DESCRIPTION OF THE DRAWINGS

FIG. 8A-B is an end view of the heat choke subassembly.

FIG. 9 is a side section view of a subassembly of the heated window assembly, which subassembly comprises the window and the heating means provided on one edge of both surfaces of the window.

FIG. 10 is a fragmentary isometric view of a portion of the window/heating means subassembly of FIG. 9 showing one of the clips which hold the heating means to both surfaces of the window.

FIG. 11 is an isometric view of the window/heater subassembly.

FIG. 12 is an end view showing the heater/window subassembly fitted to the heat choke subassembly via locator pins.

FIG. 13 is a fragmentary side section view illustrating how the heater/window subassembly is held in registry with the heat choke subassembly via locator pins in a manner which provides minimum heat transfer therebetween.

FIG. 14 is a side view of the wavy spring used to urge the window portion of the heater/window subassembly against a sealing ring on the heat choke subassembly.

DETAILED DESCRIPTION OF THE INVENTION

The invention comprises a method and apparatus for selectively heating a viewing window or viewport in an etching apparatus to facilitate optical monitoring of an etch process carried out in the etching apparatus while inhibiting the deposition of polymeric materials on the surface of the viewing window. The invention minimizes heat transfer from the heated window assembly to the etch chamber without the use of insulation materials which would deteriorate.

Figure 4:
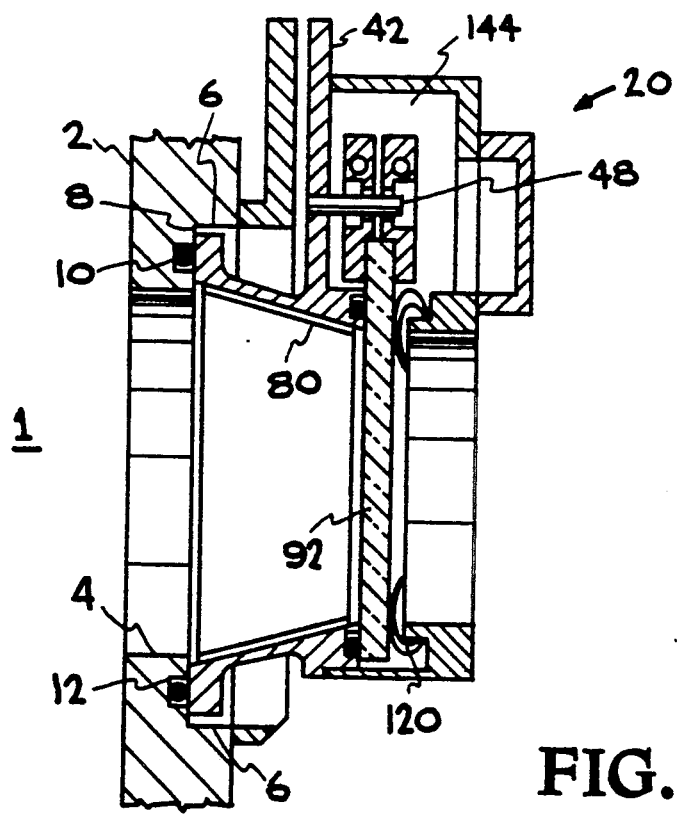
FIG. 4 is a side section view of the heated window assembly of the invention shown attached to a wall of an etching chamber.
Figure 5:
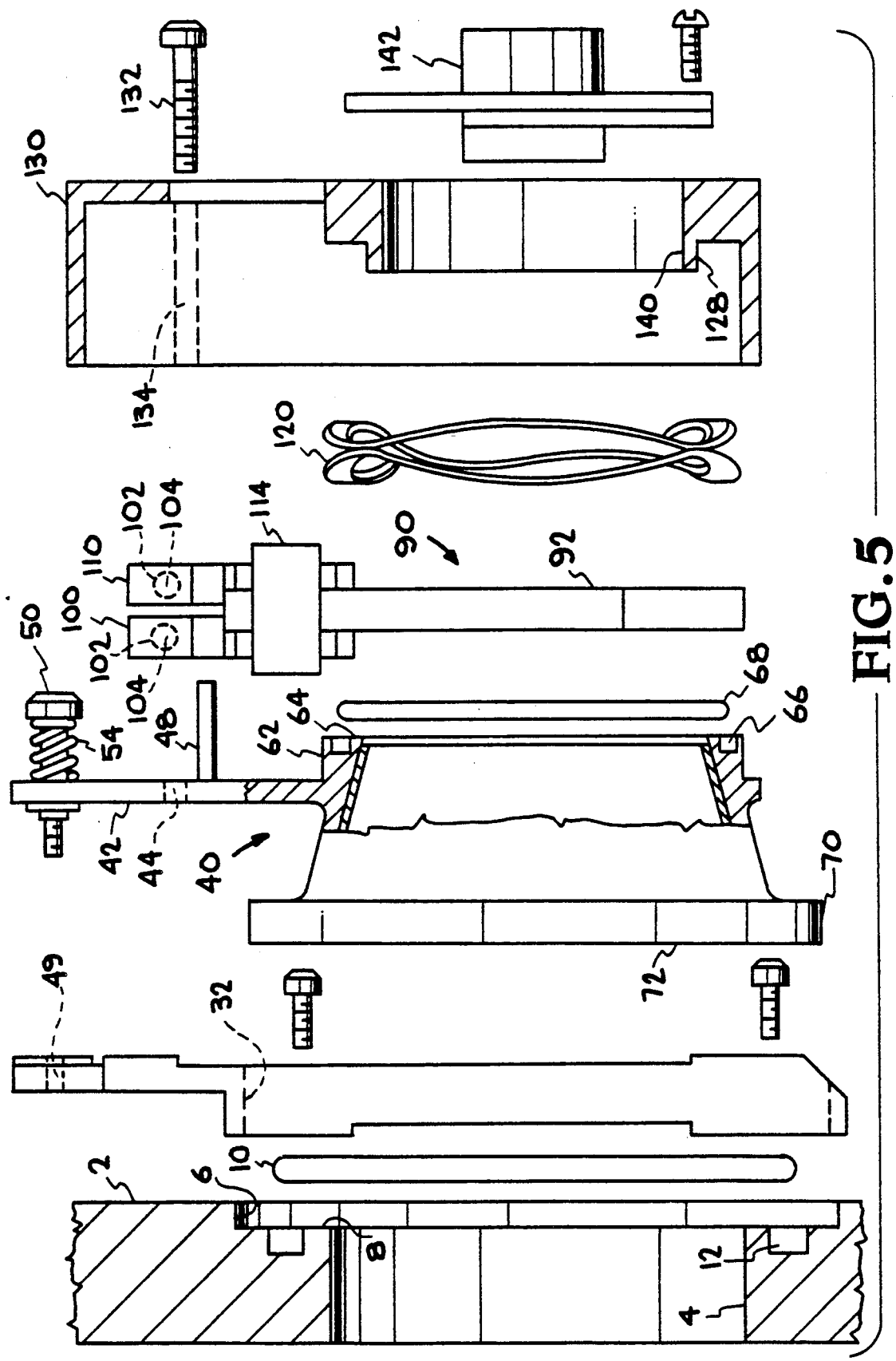
FIG. 5 is an exploded side section view of all of the subassemblies comprising the heated window assembly of the invention.

Turning now to FIGS. 4 and 5, the heated window assembly of the invention is generally shown at 20 mounted to a wall 2 of an etch chamber 1. Wall 2 is provided with a circular opening or bore 4 in the inner surface of wall 2 and an enlarged counterbore 6 in the outer surface of wall 2 to provide a shoulder 8 against which heated window assembly 20 will be sealed via an o-ring seal 10 mounted in a groove 12 formed in the face of shoulder 8.

Figure 6:
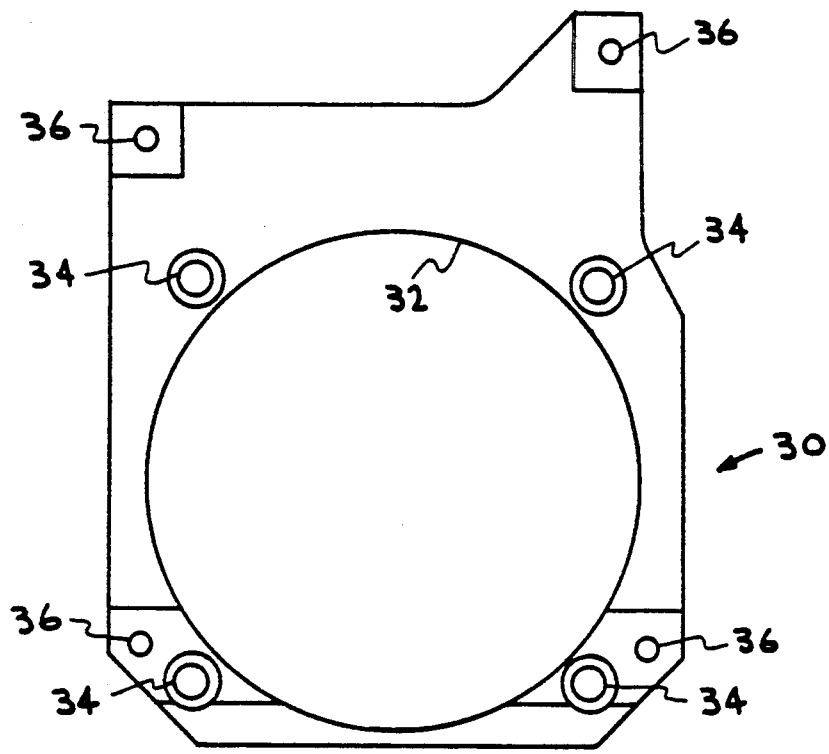
FIG. 6 is an end view of the mounting bracket used to mount the heated window assembly to an etching chamber.
Figure 7:
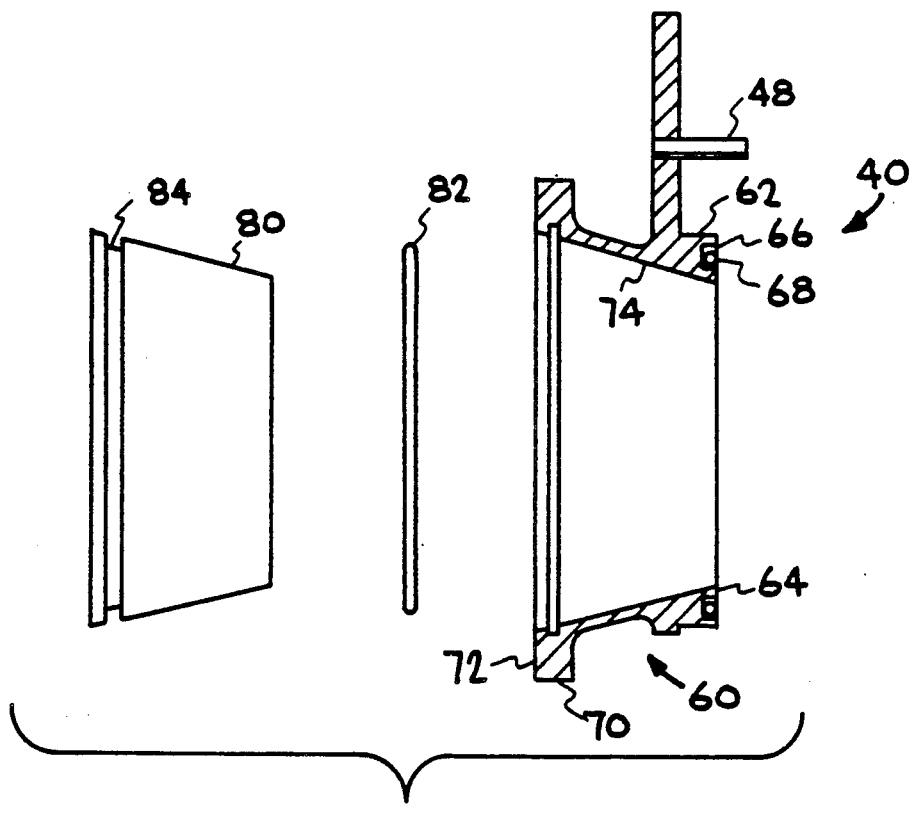
FIG. 7 is an exploded side section view of the heat choke subassembly showing how an anodized aluminum sleeve is retained in a stainless steel heat choke by a spring clip received in matching grooves in the sleeve and heat choke.

Heated window assembly 20 is mounted to wall 2 of etch chamber 1 via a mounting bracket 30, as seen in FIGS. 5 and 6, which has a central opening 32 therein of approximate the same diameter as counterbore 6 in wall 2 of etch chamber 1. Mounting bracket 30 is secured to wall 2 of etch chamber 1 via bolts through holes 34 in bracket 30 which are spaced around the perimeter of opening 32. Mounting bracket 30 is further provided with threaded bores 36 to permit securing heat choke subassembly 40 thereto, as will be described below.

Heat choke subassembly 40 comprises a plate 42, as seen in FIGS. 4, 5, 7, and 8, which is yieldably secured to mounting bracket 30 by spring loaded bolts 50, as shown in FIG. 8A, which pass through openings 44 in plate 42 to be received in threaded bores 36 in mounting bracket 30. Each spring 54 is of larger diameter than openings 44, and is mounted around bolts 50 between the surface of plate 42 and the undersurface 52 of bolt head 53. As will be described in more detail below, the spring-loaded mounting of plate 42 to bracket 30 facilitates sealing of the heated window assembly to etch chamber wall 2 via o-ring seal 10.

Plate 42 is also provided with a central circular bore 46 having the same diameter as the outer diameter of a first collar 62 on a cone shaped heat choke 60. Collar 62 has an end surface 64 having a groove 66 therein to receive an o-ring 68 which will be used to seal the window to heat choke subassembly 40 as will be described below. Since o-ring 68 will be in contact with the heated window, the material selected for o-ring 68 should be a material capable of withstanding temperatures as high as 260° C., it being understood that the temperature attainable by the heated window will be limited by the upper temperature limit of o-ring 68. Examples of o-ring materials useful in the practice of the invention include silicone elastomers (260° C.) and perfluoroelastomers (310° C.).

Cone shaped heat choke 60 is formed with a second and larger collar 70 at its opposite end. Second collar 70 has an outer diameter slightly smaller that bore 6 in etch chamber wall 2, and an end surface 72 thereon which seals against o-ring 10 in etch chamber wall 2.

Heat choke 60 is formed with a conically shaped inner surface 74 or bore which extends from outer edge 64 of collar 62 to outer edge 72 of collar 70. For assembly purposes only, the conical bore 74 is provided with an annular groove 76 which may be formed near outer edge 72 to facilitate the retention of a conical sleeve 80 within conical bore 74 using a thin wire spring clip 82 which is received into annular groove 76 and into a matching annular groove 84 in the outer surface of sleeve 80.

Heat choke 60 is formed of a material such as stainless steel having a low heat conductivity so that the heat generated to heat the window of the assembly, as will be described below, is not transmitted to chamber wall 2, i.e., to inhibit transfer of heat from heater/window subassembly 90 to etch chamber 1 without the need for deterioratable insulation materials.

However, since etch chamber 1 is usually evacuated, surfaces exposed to the vacuum must be low in outgassing and not subject to reaction with the etch chemicals used in the etch chamber. Since wall 2 of etch chamber 1 is conventionally made of aluminum, sleeve 80 is also formed of aluminum so that the surface of heat choke subassembly 60 exposed to the vacuum within etch chamber 1 comprises a matching material to chamber wall 2. If chamber wall 2 is constructed of some material other than aluminum, sleeve 80 can then be made of this same material. When sleeve 80 comprises aluminum, the sleeve, or at least the inner surface thereof, is usually anodized to protect the aluminum surface against corrosion and further reduce outgassing.

However, to minimize any heat transfer from the 10 heated window to the etch chamber, sleeve 80 is kept very thin, i.e. from about 0.3 to about 1.4 mm. in thickness. Also, as seen in FIG. 4 (in exaggerated form for illustrative purposes only), the length of sleeve 80 is preferably chosen to be slightly less than that of conical bore 74 to avoid contact (thermal coupling) between shoulder 8 of wall 2 and sleeve 80, or between sleeve 80 and the heated window to be described below.

Sealed against o-ring 68 on heat choke subassembly 60 is a heater/window subassembly 90. Heater/window subassembly 90, as seen in FIGS. 4-5 and 9-11, comprises an optically transparent planar glass member 92, which may comprise a quartz or sapphire material. When window heating assembly 20 is mounted on wall 2 of the etch chamber, planar glass member 92 will comprise the heated window of the apparatus.

In accordance with the invention, both surfaces of glass member 92 are heated adjacent one edge of member 92 by heating means 100 and 110, which are, respectively, in thermal communication with the opposite surfaces of glass member 92. Since heating means 100 and 110 are substantially identical in construction, it will be understood that the construction details to be described below for heating means 100 equally apply to heating means 110.

In its simplest form, heating means 100 may comply a block of a thermally conductive material such as aluminum provided with a heater and a surface in contact with the surface of glass member 92 adjacent one edge thereof. As shown in FIGS. 9 and 11, heating means 100 is provided with a bore 102 into which a tubular heater 104 is received. The tubular heaters 104 (one in heating means 100 and one in heating means 110) may be connected via wires 105 directly to an external power source (not shown) which functions as a heat controller. A thermocouple (not shown) may also be connected from the heat controller directly to either heating means 100 or 110 to provide monitoring and control of the amount of heat generated by tubular heaters 104.

Such a thermocouple may also be used in combination with a heating protection circuit in the heat controller to automatically shut off power to heaters 104 in case of overheating. Preferably, the heat controller is also connected in series with a thermal switch 116, as seen in FIG. 13, to redundantly protect window heating assembly 20 from overheating.

Preferably, as shown in FIGS. 9 and 11, heating means 100 is notched at 106 to decrease the overall thickness of heater/window subassembly 90 without reducing the area of heating means 100 in contact with window 92. The heat transfer from heating means 100 to window 92 may be even further enhanced by black anodizing those surfaces of heating means 100 in contact with window 92, as well as black anodizing the surfaces of bores 102 which receive tubular heaters 104.

Heating means 100, window 92 and heating means 110 are retained together as a subassembly by a pair of u-shaped spring clips 114 which respectively engage opposite end edges of heater means 100 and 110, as shown in FIGS. 10-12.

Heating means 100 is further provided with two bores 108 and larger counterbores 109, as best seen in FIG. 13, to facilitate mounting heater/window subassembly 90 to heat choke subassembly 40 via pins 48 on plate 42. As stated above, heating means 110, being constructed substantially identically to heating means 100, also is provided with similar mounting bores. The diameter of pins 48 is just slightly smaller than the diameter of bores 108 to permit mounting of heater/window subassembly 90 to heat choke subassembly 40 with sufficient lateral play or movement to allow for thermal expansion of heater means 100 and 110. The purpose of the larger bores 109 is to minimize the total contact area of pins 48 in contact with heater means 100 and 110 to minimize thermal transfer from heater means 100 and 110 to heat choke subassembly 40, as seen in FIG. 13.

When heater/window subassembly 90 is mounted to heat choke subassembly 40 via pins 48 and bores 108, the ends of leaf springs 47 mounted to plate 42 can engage the corners 94 and 96 of window member 92 to further laterally secure heater/window subassembly 90 to heat choke subassembly 40 in cooperation with pins 48, and to centrally orient window member 92 properly with respect to central circular bore 46 and collar 62. The use of leaf springs 47 and u-shaped spring clips 114 in the assembly of heater/window subassembly 90 permits thermal expansion of window member 92 which, in turn permits substantial heating of window member 92 without restricting expansion of window member 92 by hard mechanical fixturing/mounting of the subassembly.

When heater/window subassembly 90 is mounted to heat choke subassembly 40 via pins 48 and bores 108, glass member 92 is urged against o-ring 68 of heat choke subassembly 40 in sealing relationship thereto by a spring bias member 120. Spring bias member 120 may comprise any type of spring with a low spring rate, e.g., multiple small coil compression springs located about circular bore 46, but preferably comprises a wavy flat spring made of a strip of flat spring steel formed into a helix with sinusoidal undulations of length which are sized to permit intersections of the nodes of adjoining coils of the helix, as shown in FIG. 14.

Spring bias member 120 is mounted on an internal sleeve 128 on a cover member 130 which is secured to plate 42 by bolts 132 which pass through bores 134 in cover member 130 and are received in threaded bores 49 in plate 42. Cover member 130 is, in turn, formed with an opening 140 in registry with window 92 so that the interior of the etch chamber may be viewed through window 92.

Cover member 130 is also preferably constructed of a low heat transmission material such as stainless steel for the same reasons as the choice of stainless steel for the construction of heat choke 60, i.e., to inhibit transfer of heat from heater/window subassembly 90 to etch chamber 1 without the need for deterioratable insulation materials.

It should be noted, however, that the use of insulation materials to supplement (rather than replace) the materials and design disclosed herein should be deemed to be within the scope of the invention. For example, cavity 144 (shown in FIG. 4) is outside the evacuated volume and could, therefore, be filled with insulation to further thermally isolate heaters 104 from etch chamber 2.

If desired, opening 140 in cover member 130 may be fitted with a coupling 142 to an optical fiber transmission cable to transmit the optical signal to remote sensing means. An optical filter may also be provided adjacent to fiber optic cable coupling 142 in opening 140 to screen out certain wavelengths of light, e.g., UV light (below 400 nm.) which may cause damage to the human eye.

To assemble window heating assembly 20, heater window assembly 90 is mounted to choke assembly 40 via pins 48, bores 108, and spring clips 47. The window 92 is urged into sealing relationship with o-ring 68, located in groove 66 on collar 62 of choke assembly 40, by spring bias member 120 when cover 130 is bolted to plate 42 by bolts 132.

To mount window heating assembly 20 to wall 2 of the etch chamber, mounting bracket 30 is first secured to wall 2, window heating assembly 20 is then secured to mounting bracket 30 via plate 42, to thereby seal front surface 72 of choke collar 70 to etch chamber wall 2 via o-ring 10.

The spring loading of plate 42 to mounting bracket 30 permits the plane of end surface 72 on collar 70 to sealingly conform to the plane of o-ring 10 in wall 2 to permit formation of a good seal therebetween.

Figure 1:
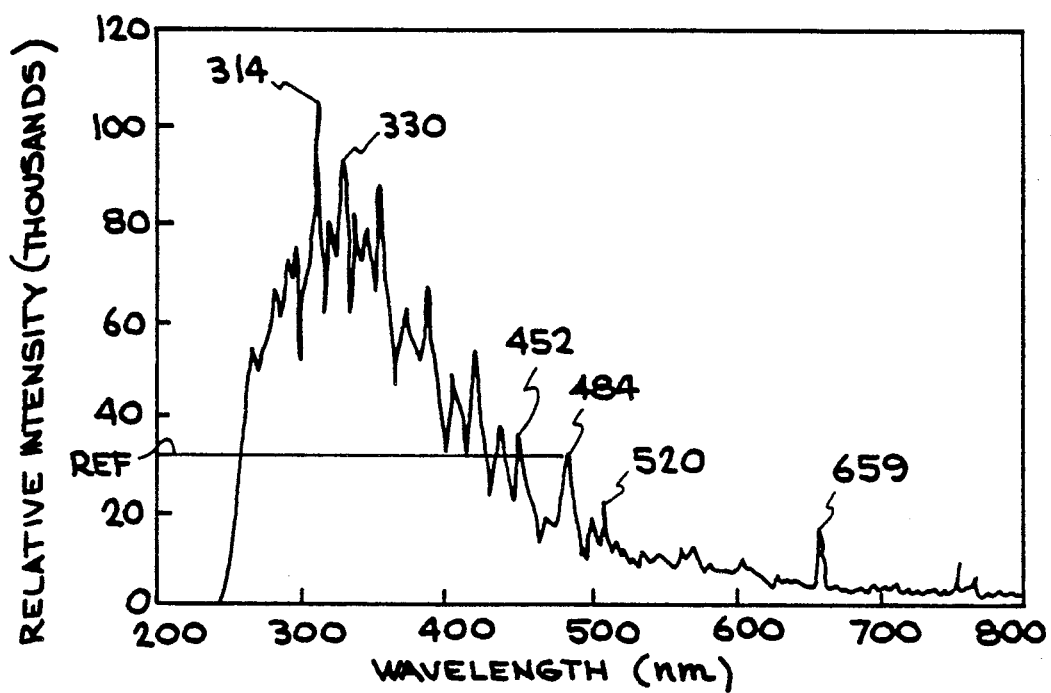
FIG. 1 is a graph depicting the optical transmission of various wavelengths through a window of a prior art plasma etching apparatus prior to deposition of polymeric materials on the inner surface of the window.
Figure 2:
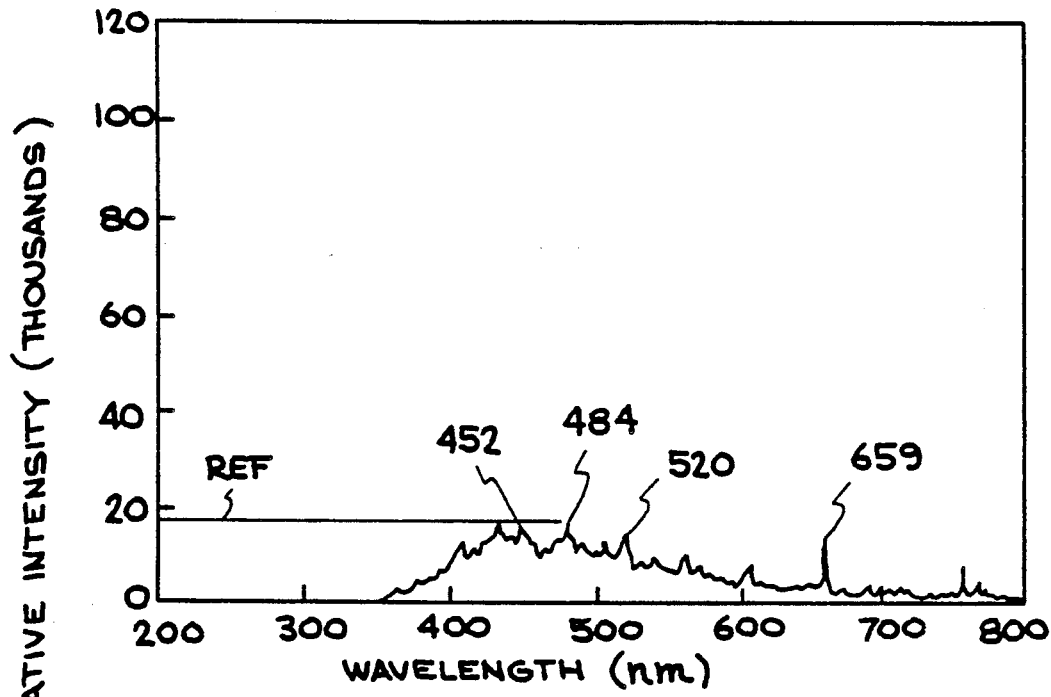
FIG. 2 is a graph depicting the optical transmission of various wavelengths through the window of the same prior art plasma etching apparatus of FIG. 1 after about 230 minutes of operation of the etch chamber illustrating the optical transmission impairment caused by deposition of polymeric material on the inner surface of the window.
Figure 3:
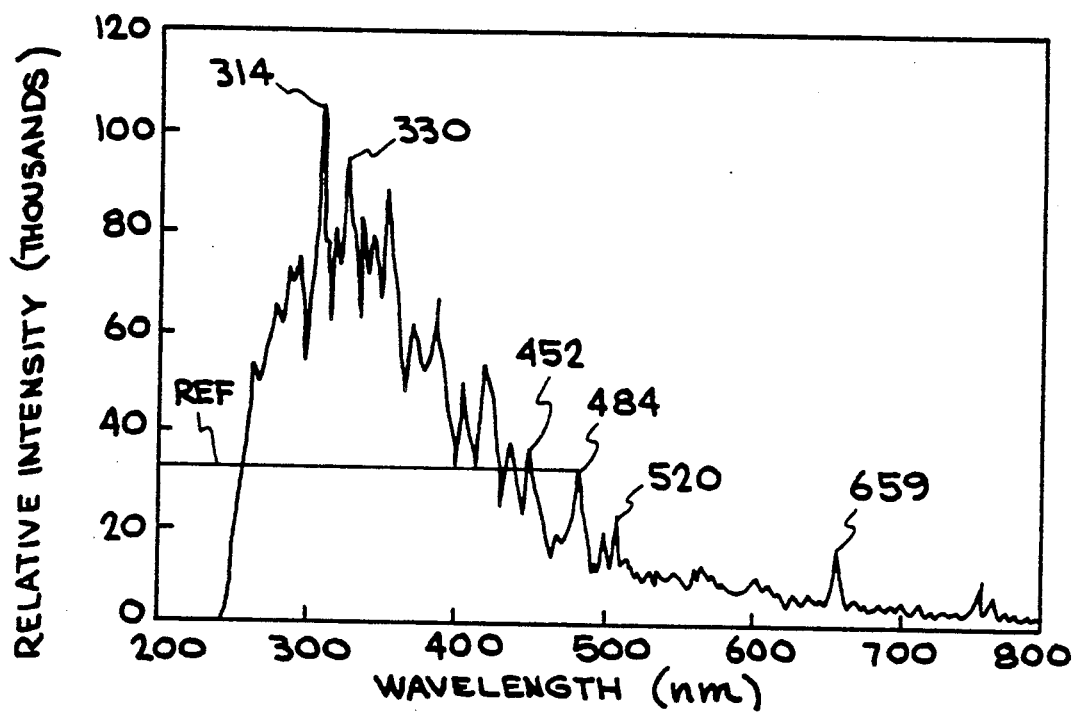
FIG. 3 is a graph depicting the optical transmission of various wavelengths through the window of a plasma etching apparatus constructed in accordance with the invention after about the same time of operation as in FIG. 2.

In accordance with the invention, the selective heating of the surfaces of glass member or window 92 adjacent one edge thereof by heating means 100 and 110 results in formation of a thermal gradient across the surfaces of window 92 with the coolest portion of each surface of window 92 spaced farthest from that portion of the surface in thermal contact with heating means 100 or 110. As a result, any deposits of polymeric materials on the surface of the window exposed to the interior of the etch chamber will either form on (or migrate to) the coolest portion of the window, leaving the center portion of window 92 relatively free of such deposits. This is verified by the graph of FIG. 3, which indicates satisfactory optical transmission through window 92, after about the same length of operation time as in the prior art construction illustrated by the graph in FIG. 2.

Having thus described the invention what is claimed is:

1. Apparatus for inhibiting obstruction of an optically transparent window in a semiconductor etch process chamber apparatus by deposition of polymeric materials thereon which comprises means for selectively heating opposite surfaces of said window adjacent one edge thereof to thereby form a thermal gradient across the surfaces of said window from said heated surfaces adjacent said one edge to a cool region on said window surfaces adjacent an opposite edge of said window, whereby the center portion of said surfaces of said window will remain substantially clear of such depositions.

2. The apparatus of claim 1 wherein said means for selectively heating said window comprise:
   a) first heating means disposed on one of said opposite surfaces of said window adjacent said one edge; and
   b) second heating means disposed on the other of said opposite surfaces of said window adjacent said same edge;
to thereby provide even heating of said opposite window surfaces adjacent said one edge of said window.

3. The apparatus of claim 1 which further comprises stainless steel spacer means for thermally isolating said heated window from said etch chamber.

4. Apparatus for inhibiting obstruction of an optically transparent window in a semiconductor etch process chamber apparatus by deposition of polymeric materials thereon which comprises:
   a) an optically transparent window;
   b) means for selectively heating opposite surfaces of said window adjacent one edge thereof comprising:
      i) first heating means disposed on one of said opposite surfaces of said window adjacent said one edge; and
      ii) second heating means disposed on the other of said opposite surfaces of said window adjacent said same edge;
   to thereby form a thermal gradient across the surfaces of said window from said heated surfaces adjacent said one edge to a cool region on said window surfaces adjacent an opposite edge of said window, whereby the center portion of said surfaces of said window will remain substantially clear of such depositions; and
   c) spacer means for thermally isolating said heated window from said etch chamber.

5. The apparatus of claim 4 wherein said spacer means comprise stainless steel spacer means.

6. The apparatus of claim 4 wherein said apparatus further comprises o-ring sealing means to seal one surface of said spacer means to a wall of said chamber; and second o-ring sealing means to seal an opposite surface of said spacer to said heated window.

7. The apparatus of claim 6 wherein said apparatus further comprises first spring bias means to yieldably urge said spacer against said first o-ring sealing means between said first surface of said spacer and said etch chamber wall; and second spring bias means to yieldably urge said heated window against said second o-ring sealing means between said window and said opposite surface of said spacer.

8. The apparatus of claim 6 which further comprises a bore in said spacer extending between said one surface of said spacer to said opposite surface, and sleeve means received within said spacer bore constructed of the same material as said wall of said etch chamber.

9. The apparatus of claim 8 wherein said wall of said etch chamber comprises aluminum and said sleeve in said bore in said spacer also comprises aluminum.

10. The apparatus of claim 9 wherein said sleeve is shorter than said bore in said spacer so that said sleeve does not form a thermal bridge between said etch chamber wall and said sleeve, or between said heated window and said sleeve.

11. The apparatus of claim 4 wherein said first and second heating means disposed on said opposite surfaces of said window adjacent said one edge each further comprise a metal member having a surface in contact with a surface of said window, and a heating element within said metal member.

12. The apparatus of claim 11 wherein said surface of said metal member in contact with said window surface is provided with thermal transmission enhancing means thereon.

13. The apparatus of claim 12 wherein each of said metal members comprise aluminum and said thermal transmission enhancing means on said surface thereof in contact with said window surface comprises an anodized coating thereon capable of enhancing the transmission of heat from said metal member to said window surface.

14. The apparatus of claim 11 wherein yieldable bias means engage both of said metal members to yieldably urge said metal members against said opposite surfaces of said window, while not inhibiting thermal expansion and contraction of said window.

15. The apparatus of claim 14 wherein said yieldable bias means comprise metal spring clips.

16. The apparatus of claim 14 wherein said spacer is further provided with a mounting plate to permit said metal members and said window clamped thereto to be mounted to said mounting plate.

17. The apparatus of claim 16 wherein said metal members are provided with a plurality of bores which receive pins provided on said mounting plate.

18. The apparatus of claim 17 wherein a portion of said bores in said metal members are enlarged to minimize thermal coupling between said metal members and said pins on said mounting plate.

19. The apparatus of claim 18 wherein said mounting plate is further provided with spring means to yieldably engage edges of said window to laterally locate said window on said mounting plate while permitting thermal expansion and contraction of said window.

20. An etching apparatus comprising an optically transparent window assembly for monitoring an etch process in an etch chamber therein which comprises:
  1) an optically transparent window;
  b) spacer means to thermally isolate said window from a wall of said chamber;
  c) means for sealing one surface of said spacer means to said wall of said chamber, including an o-ring seal means between said chamber wall and said one surface of said spacer means and yieldable bias means to urge said spacer means against said o-ring means;
  d) means for sealing an opposite surface of said spacer means to a surface of said window, including second o-ring seal means between said window and said opposite surface of said spacer means and yieldable bias means to urge said window against said second o-ring means;
  e) a bore in said spacer extending between said one surface of said spacer to said opposite surface, and sleeve means received within said spacer bore constructed of the same material as said wall of said etch chamber; the length of said sleeve being shorter than said bore in said spacer so that said sleeve does not form a thermal bridge between said etch chamber wall and said sleeve, or between said heated window and said sleeve; and
  f) means for selectively heating opposite surfaces of said window adjacent one edge thereof comprising:
    i) first heating means disposed on one of said opposite surfaces of said window adjacent said one edge; and
    ii) second heating means disposed on the other of said opposite surfaces of said window adjacent said same edge;
  to thereby form a thermal gradient across the surfaces of said window from said heated surfaces adjacent said one edge to a cool region on said window surfaces adjacent an opposite edge of said window, whereby the center portion of said surfaces of said window will remain substantially clear of such depositions.

21. A method for inhibiting obstruction of a viewing window of a semiconductor etch process chamber by deposition of polymeric materials thereon which comprises selectively heating opposite surfaces of said window adjacent one edge thereof to thereby form a temperature gradient across said window surfaces extending from said one window edge to an opposite edge of said window whereby a center portion of said surfaces of said window will remain substantially clear of such depositions.

22. The method of claim 21 wherein said step of selectively heating said opposite surfaces of said window further comprises:
  a) proving first heating means disposed on one of said opposite surfaces of said window adjacent said one edge; and
  b) providing second heating means disposed on the other of said opposite surfaces of said window adjacent said same edge;
to thereby provide even heating of said opposite window surfaces adjacent said one edge of said window.

23. The method of claim 21 which further comprises thermally isolating said heated window from said etch chamber by providing stainless steel spacing means therebetween.

24. The method of claim 23 which further comprises sealing one surface of said stainless steel spacer to a wall of said etch chamber and an opposite surface of said spacer to said window.

25. The method of claim 24 which further comprises yieldably biasing said one surface of said spacer against said wall and yieldably biasing said window against said opposite surface of said spacer.

* * * * *